US008039726B2

(12) United States Patent
Zhang et al.

(10) Patent No.: US 8,039,726 B2
(45) Date of Patent: Oct. 18, 2011

(54) THERMAL TRANSFER AND POWER GENERATION DEVICES AND METHODS OF MAKING THE SAME

(75) Inventors: An-Ping Zhang, Niskayuna, NY (US); Fazila Seker, Clifton Park, NY (US); Reed Roeder Corderman, Niskayuna, NY (US); Shixue Wen, Montreal (CA); Fred Sharifi, Niskayuna, NY (US); Melissa Suzanne Sander, Albany, NY (US); Craig Douglas Young, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 1167 days.

(21) Appl. No.: 11/138,615

(22) Filed: May 26, 2005

(65) Prior Publication Data
US 2006/0266402 A1 Nov. 30, 2006

(51) Int. Cl.
*H01L 35/30* (2006.01)
(52) U.S. Cl. ........... 136/205; 136/203; 136/211; 62/3.3; 62/3.2; 438/34; 428/131
(58) Field of Classification Search .......... 136/205, 136/203, 211; 62/3.2, 3.3; 438/64; 428/131
See application file for complete search history.

(56) References Cited

U.S. PATENT DOCUMENTS

| | | | |
|---|---|---|---|
| 4,148,192 A | 4/1979 | Cummings | 60/716 |
| 5,817,188 A * | 10/1998 | Yahatz et al. | 136/237 |
| 5,968,456 A | 10/1999 | Parise | 422/174 |
| 6,119,463 A | 9/2000 | Bell | 62/3.7 |
| 6,223,539 B1 | 5/2001 | Bell | 62/3.7 |
| 6,252,154 B1 * | 6/2001 | Kamada et al. | 136/201 |
| 6,388,185 B1 * | 5/2002 | Fleurial et al. | 136/205 |
| 6,539,725 B2 | 4/2003 | Bell | 62/3.7 |
| 6,552,255 B1 | 4/2003 | Tritt et al. | 136/203 |
| 6,598,405 B2 | 7/2003 | Bell | 62/3.3 |
| 6,606,866 B2 | 8/2003 | Bell | 62/3.7 |
| 6,625,990 B2 | 9/2003 | Bell | 62/3.3 |
| 6,637,210 B2 | 10/2003 | Bell | 62/3.7 |

(Continued)

FOREIGN PATENT DOCUMENTS

WO WO 02/073699 A2 9/2002

(Continued)

OTHER PUBLICATIONS

Wang W., et al.: "A New Type of Low Power Thermoelectric Micro-Generator Fabricated by Nanowire Array Thermoelectric Material" Microelectronic Engineering, Elsevier Publishers BV., Amsterdam, NL, vol. 77, No. 3-4, Apr. 2005, pp. 223-229.

(Continued)

*Primary Examiner* — Alexa Neckel
*Assistant Examiner* — Golam Mowla
(74) *Attorney, Agent, or Firm* — Joseph J. Christian

(57) ABSTRACT

A device includes a first thermally conductive substrate having a first patterned electrode disposed thereon and a second thermally conductive substrate having a second patterned electrode disposed thereon, wherein the first and second thermally conductive substrates are arranged such that the first and second patterned electrodes are adjacent to one another. The device includes a plurality of nanowires disposed between the first and second patterned electrodes, wherein the plurality of nanowires is formed of a thermoelectric material. The device also includes a joining material disposed between the plurality of nanowires and at least one of the first and second patterned electrodes.

25 Claims, 10 Drawing Sheets

U.S. PATENT DOCUMENTS

| | | | |
|---|---|---|---|
| 6,672,076 B2 | 1/2004 | Bell | 62/3.3 |
| 7,098,393 B2 | 8/2006 | Fleurial et al. | |
| 2002/0017102 A1 | 2/2002 | Bell | 62/3.7 |
| 2002/0175408 A1 | 11/2002 | Majumdar et al. | 257/734 |
| 2003/0005706 A1 | 1/2003 | Bell | 62/3.7 |
| 2003/0047204 A1 | 3/2003 | Fleurial et al. | 136/200 |
| 2004/0020217 A1 | 2/2004 | Bell | 62/3.3 |
| 2004/0031514 A1 | 2/2004 | Bell | 136/203 |
| 2004/0055312 A1 | 3/2004 | Bell | 62/3.7 |
| 2004/0076214 A1 | 4/2004 | Bell | 374/13 |
| 2005/0072165 A1 | 4/2005 | Bell | 62/3.7 |
| 2005/0112872 A1 | 5/2005 | Okamura et al. | |
| 2005/0161662 A1 | 7/2005 | Majumdar et al. | |
| 2006/0032526 A1* | 2/2006 | Fukutani et al. | 136/205 |
| 2006/0118158 A1* | 6/2006 | Zhang et al. | 136/205 |
| 2006/0266402 A1 | 11/2006 | Zhang et al. | |

FOREIGN PATENT DOCUMENTS

| | | |
|---|---|---|
| WO | WO 03/046265 A2 * | 6/2003 |
| WO | WO 2005/017331 A2 | 2/2005 |

OTHER PUBLICATIONS

Abramson A. R., et at.: "Fabrication and Characterization of a Nanowire/Polymer-Based Nanocomposit for a Prototype Termoelectric Device" Journal of Mictroelectromechancial Systems, IEEE Service Center, Piscataway, NJ, US, vol. 13, No. 3, Jun. 2004, pp. 505-513.

* cited by examiner

THERMAL TRANSFER AND POWER GENERATION DEVICES AND METHODS OF MAKING THE SAME

BACKGROUND

The invention relates generally to heat transfer and power generation devices, and more particularly, to solid-state heat transfer devices.

Heat transfer devices may be used for a variety of heating/cooling and power generation/heat recovery systems, such as refrigeration, air conditioning, electronics cooling, industrial temperature control, waste heat recovery, and power generation. These heat transfer devices are also scalable to meet the thermal management needs of a particular system and environment. However, existing heat transfer devices, such as those relying on refrigeration cycles, are environmentally unfriendly, have limited lifetime, and are bulky due to mechanical components such as compressors and the use of refrigerants.

In contrast, solid-state heat transfer devices offer certain advantages, such as, high reliability, reduced size and weight, reduced noise, low maintenance, and a more environmentally friendly device. For example, thermoelectric devices transfer heat by flow of electrons and holes through pairs of p-type and n-type semiconductor thermoelements forming structures that are connected electrically in series and thermally in parallel. However, due to the relatively high cost and low efficiency of the existing thermoelectric devices, they are restricted to small scale applications, such as automotive seat coolers, generators in satellites and space probes, and for local heat management in electronic devices.

At a given operating temperature, the heat transfer efficiency of thermoelectric devices can be characterized by the figure-of-merit that depends on the Seebeck coefficient, electrical conductivity and the thermal conductivity of the thermoelectric materials employed for such devices. Many techniques have been used to increase the heat transfer efficiency of the thermoelectric devices through improving the figure-of-merit value. For example, in some heat transfer devices two-dimensional superlattice thermoelectric materials have been employed for increasing the figure-of-merit value of such devices. Such devices may require deposition of two-dimensional superlattice thermoelectric materials through techniques, such as molecular beam epitaxy or vapor phase deposition. However, such techniques are time consuming, are relatively expensive, are limited to small-scale applications, and require significant expertise.

Accordingly, there is a need to provide a thermal transfer device that has enhanced efficiency achieved through improved figure-of-merit of the thermal transfer device. It would also be advantageous to provide a device that is scalable to meet the thermal management needs of a particular system and environment.

BRIEF DESCRIPTION

Briefly, in accordance with one aspect of the present invention a device includes a first thermally conductive substrate having a first patterned electrode disposed thereon and a second thermally conductive substrate having a second patterned electrode disposed thereon, wherein the first and second thermally conductive substrates are arranged such that the first and second patterned electrodes are adjacent to one another. The device includes a plurality of nanowires disposed between the first and second patterned electrodes, wherein the plurality of nanowires is formed of a thermoelectric material. The thermal transfer device also includes a joining material disposed between the plurality of nanowires and at least one of the first and second patterned electrodes.

In accordance with another aspect of the present invention a method of manufacturing a device includes providing a first thermally conductive substrate having a first patterned electrode disposed thereon and providing a second thermally conductive substrate having a second patterned electrode disposed thereon. The method also includes depositing a plurality of nanowires within a thermally and electrically insulating template disposed between the first and second patterned electrodes and disposing a joining material between the plurality of nanowires and the first and second patterned electrodes.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
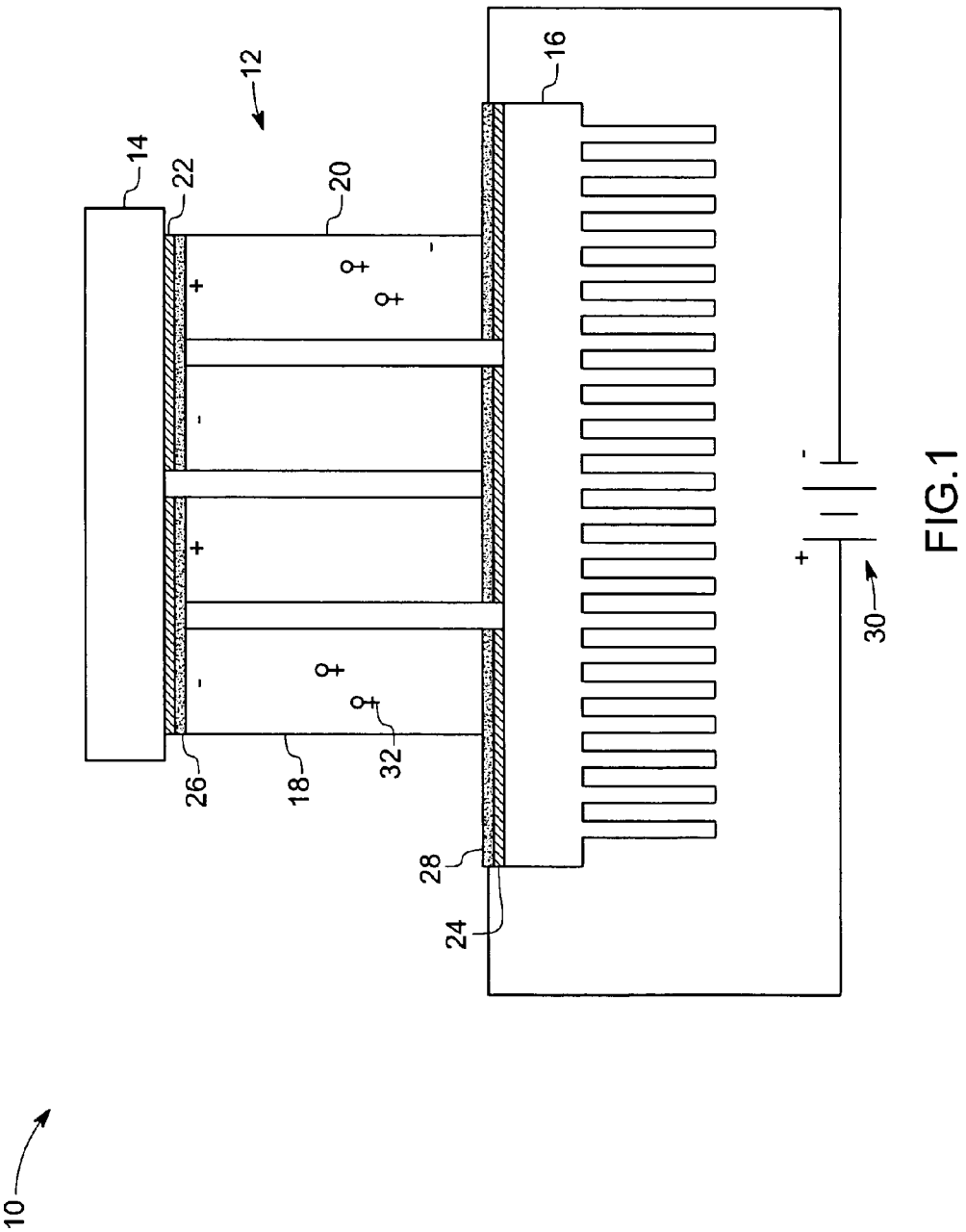
FIG. 1 is a diagrammatical illustration of a system having a thermal transfer device in accordance with aspects of the present technique.

Referring now to the drawings, FIG. 1 illustrates a system 10 having a plurality of thermal transfer devices in accordance with certain embodiments of the present technique. As illustrated, the system 10 includes a thermal transfer module such as represented by reference numeral 12 that transfers heat from an area or object 14 to another area or object 16 that may function as a heat sink for dissipating the transferred heat. Thermal transfer module 12 may be used for generating power or to provide heating or cooling of the components. Further, the components for generating heat such as object 14 may generate low-grade heat or high-grade heat. As will be discussed below, the first and second objects 14 and 16 may be components of a vehicle, or a turbine, or an aircraft engine, or a solid oxide fuel cell, or a refrigeration system. It should be noted that, as used herein the term "vehicle" may refer to a land-based, an air-based or a sea-based means of transportation. In this embodiment, the thermal transfer module 12 includes a plurality of thermoelectric devices. The thermoelectric module 12 comprises n-type semiconductor legs 18 and p-type semiconductor legs 20 that function as thermoelements, whereby heat generated by charge transport is transferred away from the object 14 towards the object 16. In this embodiment, the n-type and p-type semiconductor legs 18 and 20 are disposed on patterned electrodes 22 and 24 that are coupled to the first and second objects 14 and 16, respectively. In certain embodiments, the patterned electrodes 22 and 24 may be disposed on thermally conductive substrates (not shown) that may be coupled to the first and second objects 14 and 16. Further, interface layers 26 and 28 are employed to electrically connect pairs of the n-type and p-type semiconductor legs 18 and 20 on the patterned electrodes 22 and 24.

In this embodiment, the n-type and p-type semiconductor legs 18 and 20 are coupled electrically in series and thermally in parallel. In certain embodiments, a plurality of pairs of n-type and p-type semiconductors 18 and 20 may be used to form thermocouples that are connected electrically in series and thermally in parallel for facilitating the heat transfer. In operation, an input voltage source 30 provides a flow of current through the n-type and p-type semiconductors 18 and 20. As a result, the positive and negative charge carriers transfer heat energy from the first electrode 22 onto the second electrode 24. Thus, the thermoelectric module 12 facilitates heat transfer away from the object 14 towards the object 16 by a flow of charge carriers 32 between the first and second electrodes 22 and 24. In certain embodiments, the polarity of the input voltage source 30 in the system 10 may be reversed to enable the charge carriers to flow from the object 16 to the object 14, thus heating the object 14 and causing the object 14 to function as a heat sink. As described above, the thermoelectric module 12 may be employed for heating or cooling of objects 14 and 16. Further, the thermoelectric module 12 may be employed for heating or cooling of objects in a variety of applications such as air conditioning and refrigeration systems, cooling of various components in applications such as an aircraft engine, or a vehicle, or a turbine and so forth. In certain embodiments, the thermoelectric device 12 may be employed for power generation by maintaining a temperature gradient between the first and second objects 14 and 16, respectively that will be described below.

Figure 2:
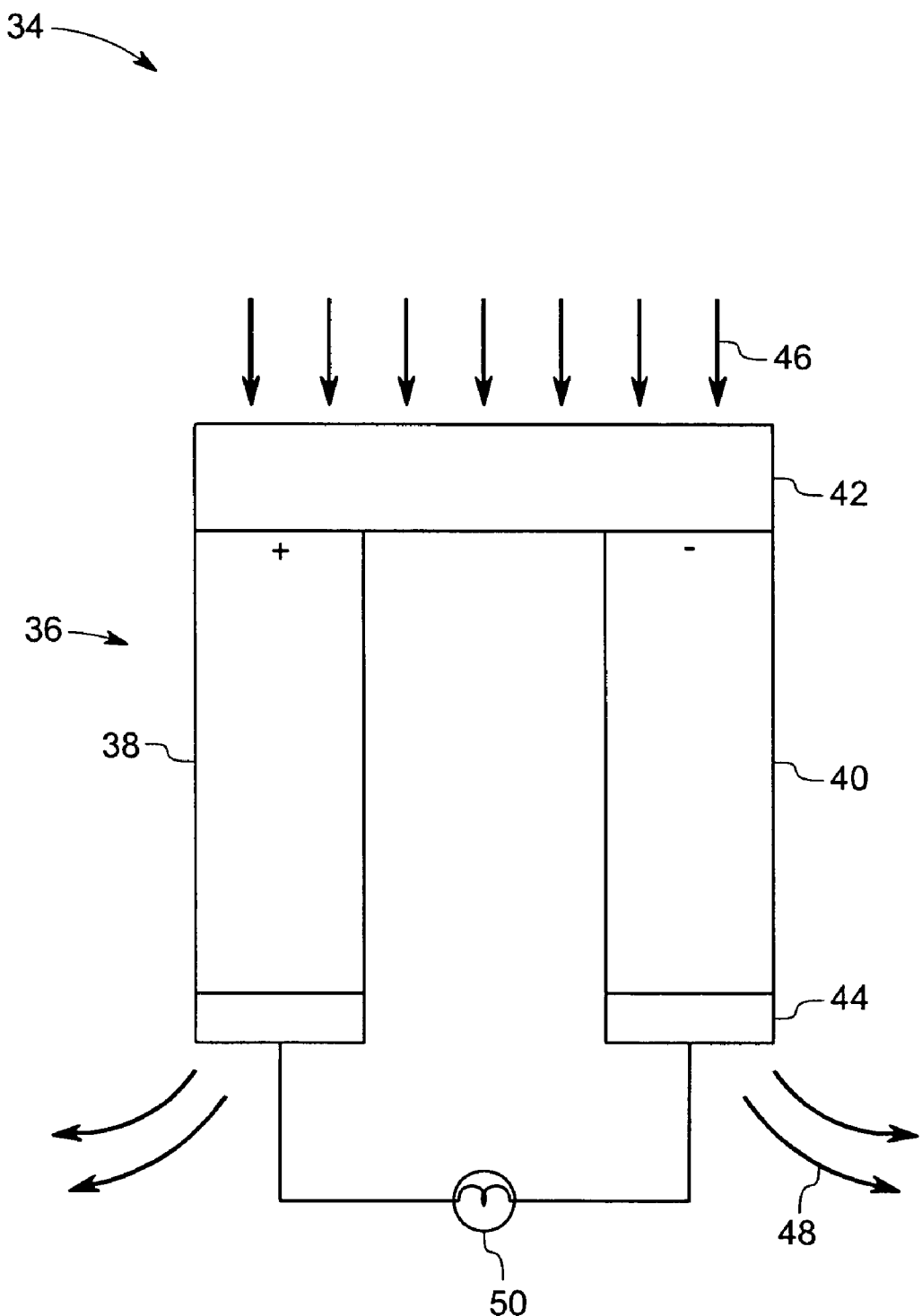
FIG. 2 is a diagrammatical illustration of a power generation system having a thermal transfer device in accordance with aspects of the present technique.

FIG. 2 illustrates a power generation system 34 having a thermal transfer device 36 in accordance with aspects of the present technique. The thermal transfer device 36 includes a p-type leg 38 and an n-type leg 40 configured to generate power by maintaining a temperature gradient between a first substrate 42 and a second substrate 44. In this embodiment, the p-type and n-type legs 38 and 40 are coupled electrically in series and thermally in parallel to one another. In operation, heat is pumped into the first interface 42, as represented by reference numeral 46 and is emitted from the second interface 44 as represented by reference numeral 48. As a result, an electrical voltage 50 proportional to a temperature gradient between the first substrate 42 and the second substrate 44 is generated due to a Seebeck effect that may be further utilized to power a variety of applications that will be described in detail below. Examples of such applications include, but are not limited to, use in a vehicle, a turbine and an aircraft engine. Additionally, such thermoelectric devices may be coupled to photovoltaic or solid oxide fuel cells that generate heat including low-grade heat and high-grade heat thereby boosting overall system efficiencies. It should be noted that a plurality of thermocouples having the p-type and n-type thermoelements 38 and 40 may be employed based upon a desired power generation capacity of the power generation system 34. Further, the plurality of thermocouples may be coupled electrically in series, for use in a certain application.

Figure 3:
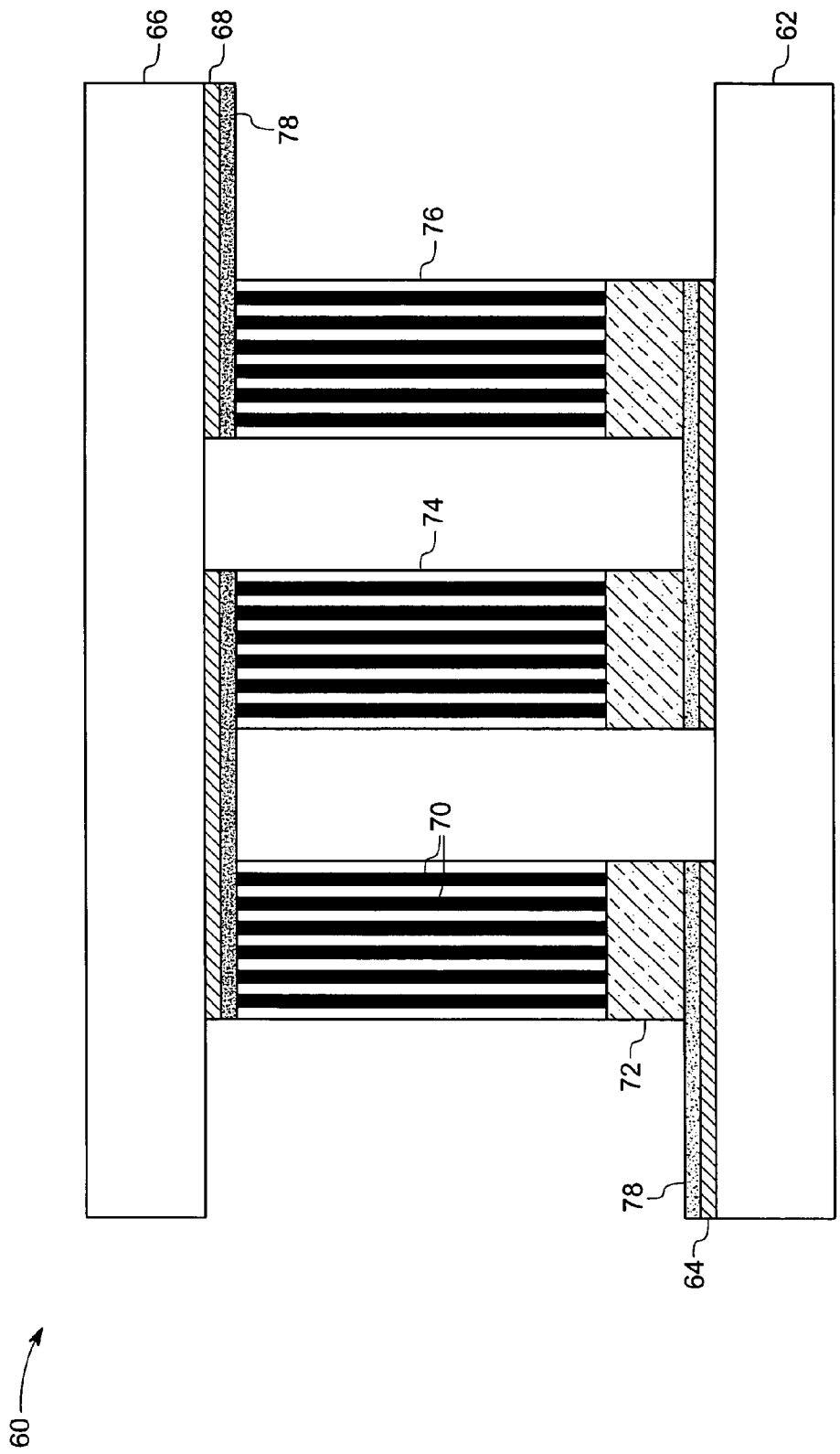
FIG. 3 is a cross-sectional view of a thermal transfer module in accordance with aspects of the present technique.

FIG. 3 illustrates a cross-sectional view of an exemplary configuration 60 of the thermal transfer device of FIGS. 1 and 2. It should be noted that the details for the components of the thermal transfer device 60 are discussed with reference to FIGS. 4-13. The thermal transfer device 60 includes a first thermally conductive substrate 62 having a first patterned electrode 64 disposed on the first thermally conductive substrate 62. The thermal transfer device 60 also includes a second thermally conductive substrate 66 having a second patterned electrode 68 disposed thereon. In this embodiment, the first and second thermally conductive substrates 62 and 66 include a thermally conductive and electrically insulating ceramic. However, other thermally conductive and electrically insulating materials may be employed for the first and second thermally conductive substrates 62 and 66. For example, electrically insulating aluminum nitride or silicon carbide ceramic may be used for the first and second thermally conductive substrates 62 and 66. In certain embodiments, the patterned electrodes 64 and 68 include a metal such as aluminum, copper and so forth. In certain embodiments, the patterned electrodes may include highly doped semiconductors. Further, the patterning of the electrodes 64 and 68 on the first and second thermally conductive substrates 62 and 66 may be achieved by utilizing techniques such as etching, photoresist patterning, shadow masking, lithography, or other standard semiconductor patterning techniques.

In a presently contemplated configuration the first and second thermally conductive substrates 62 and 66 are arranged such that the first and second patterned electrodes 64 and 68 are adjacent to one another.

Moreover, a plurality of nanowires 70 is disposed on a conductive substrate 72 between the first and second patterned electrodes 64 and 68. The conductive substrate 72 may include Copper, Gold or other metals. Further, highly doped Silicon, highly doped Gallium Arsenide, Silicon Carbide, Aluminium Nitride, Gallium Nitride, or other highly doped semiconductors, or combinations thereof may be employed for the conductive substrate 72. Further, each of the plurality of nanowires 70 is formed of a thermoelectric material. Examples of thermoelectric materials include silicon germanium based alloys, bismuth antimonide based alloys, lead telluride based alloys, bismuth telluride based alloys, or other III-V, IV, IV-VI, and II-VI semiconductors, or any combinations thereof having substantially high thermoelectric figure-of-merit, and their combinations thereof. In a presently contemplated configuration, the plurality of nanowires 70 includes one-dimensional nanowires, or segmented nanowires, or zero-dimensional superlattice nanowires. Each of the plurality of nanowires 70 may include a p-type nanowire or an n-type nanowire that is electrochemically deposited on the substrate 72 to form thermoelements 74 and 76 of the thermal transfer device 60. For example, a plurality of p-type nanowires 70 may be deposited on the substrate 72 to form the thermoelement 74. Similarly, a plurality of n-type nanowires 70 may be deposited on the substrate 72 to form the thermoelement 76. It should be noted that, for ease of illustration some of the elements of the thermoelements 74 and 76 are not shown here. However, such features are described in detail below with reference to FIGS. 4-13. In the present exemplary embodiment, the length of the nanowires 70 ranges from about 1 µm to about 1000 µm. Further, the diameter of the nanowires 70 ranges from about 1 nanometer to about 500 nanometers. The thermal transfer device 60 also includes a joining material 78 disposed between the plurality of nanowires 70 and the first and second patterned electrodes 64 and 68 for reducing the electrical and thermal resistance of the interface. In certain embodiments, the joining material 78 between the nanowires 70 and the first patterned electrode 64 may be different than the joining material 78 between the nanowires 70 and the second patterned electrode 68. In one embodiment, the joining material 78 includes silver epoxy. It should be noted that other conductive adhesives may be employed as the joining material 78. In particular, the joining material 78 is disposed between the substrate 72 and the patterned electrode 64. Further, in certain embodiments, the joining material 78 is disposed between the patterned electrode 68 and a metal coating disposed on the nanowires 70 that will be described in detail with reference to FIG. 9.

In some other embodiments, the plurality of nanowires 70 may be bonded to the patterned electrodes 64 and 68 by diffusion bonding through atomic diffusion of materials at the joining interface or other techniques such as wafer fusion bonding for semiconductor interfaces. As will be appreciated by one skilled in the art, diffusion bonding causes microdeformation of surface features leading to sufficient contact on an atomic scale to cause the two materials to bond. In certain embodiments, gold may be employed as an interlayer for the bonding and the diffusion bonds may be achieved at relatively low temperatures of about 300° C. In certain other embodiments indium or indium alloys may be employed as an interlayer for the bonding at temperatures of about 100° C. to about 150° C. Further, a typical solvent cleaning step may be applied on the surfaces to achieve flat and clean surfaces for applying diffusion bonding. Examples of solvents for the cleaning step include acetone, isopropanol, methanol and so forth. Further, metal coatings may be disposed on the top and bottom surfaces of the thermoelements 74 and 76 and the substrate 72 to facilitate the bonding between the nanowires 70 and the first and second substrates 62 and 66. In one embodiment, the thermoelements 74 and 76 may be bonded to the patterned electrodes 64 and 68 through direct diffusion bonding. Alternatively, the thermoelements 74 and 76 may be bonded to the patterned electrodes 64 and 68 via an interlayer, such as gold, metal, or solder metal alloy foil. Again, it should be noted that the thermoelements 74 and 76 include the nanowires 70 disposed on the substrate 72. Further, the thermoelements 74 and 76 also include metal coatings disposed on the nanowires that is described in detail with reference to FIG. 9. In certain embodiments, the bonding between the nanowires 70 and the first and second substrates 62 and 66 may be achieved through an interface layer such as silver epoxy. However, other joining methods may be employed to achieve the bonding between the nanowires 70 and the first and second substrates 62 and 66. The thermoelements 74 and 76 described above may be fabricated by a variety of techniques. FIGS. 4-14 illustrate components of the thermal transfer devices of FIGS. 1, 2, and 3.

Figure 4:
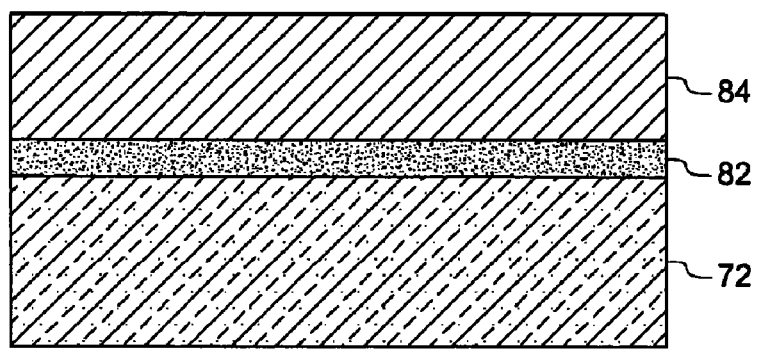
FIG. 4 is a cross-sectional view of a substrate for creating a template for depositing nanowires for a thermoelement of the thermal transfer device of FIG. 3 in accordance with aspects of the present technique.

Referring now to FIG. 4 a cross-sectional view of an exemplary configuration 80 of the substrate 72 for forming the thermoelements 74 and 76 of FIG. 3 is illustrated. The configuration 80 includes a joining material layer 82 disposed on the substrate 72. In one embodiment, the joining material layer 82 includes silver epoxy. Further, an aluminum layer 84 is disposed on the joining material layer 82 to form a both thermally and electrically insulating anodic aluminum oxide template for depositing nanowires on the substrate 72 as described below with reference to FIG. 5. In certain embodiments, the aluminum layer 84 is disposed on the substrate 72. In certain embodiments, the aluminum layer 84 may be pre-polished through electrochemical, or mechanical, or chemical mechanical polishing to achieve a smooth surface of the aluminum layer 84. Further, in certain embodiments a metal coating may be disposed on the bottom surface of the aluminum layer 84 and on the top surface of the substrate 72 to facilitate bonding.

Figure 5:
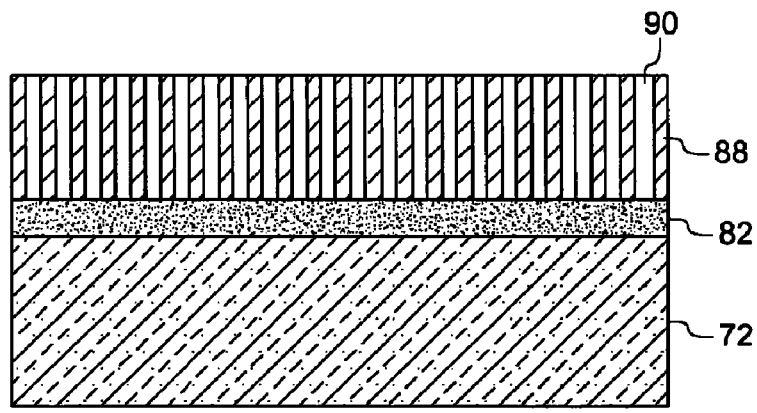
FIG. 5 is a cross-sectional view of a thermally and electrically insulating template formed on the substrate of FIG. 4 for depositing nanowires for a thermoelement of the thermal transfer device of FIG. 3 in accordance with aspects of the present technique.

FIG. 5 illustrates a cross-sectional view of an exemplary configuration 86 of a thermally insulating template formed on the substrate 72 of FIG. 4 for depositing nanowires. In the illustrated embodiment, the aluminum layer 84 (see FIG. 4) is anodized to form anodic aluminum oxide 88 that forms the thermally and electrically insulating template 88 for the growth of the nanowires within pores 90 of the anodic aluminum oxide 88. In certain other embodiments, the insulating template 88 may include track etched polycarbonate, aerogel, porous glass or different combinations thereof. In this embodiment, nanowires may be disposed within the pores 90 of the insulating template 88 on the substrate 72. Again, a metal coating may be disposed on the bottom surface of the anodic aluminum oxide 88 and on the top surface of the substrate 72 to facilitate bonding between the layers.

Figure 6:
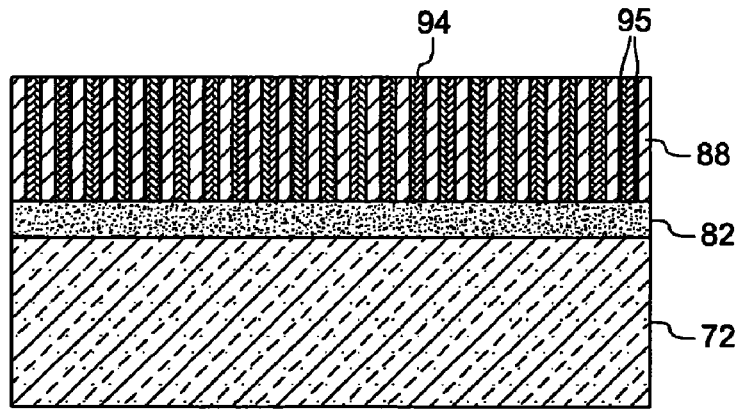
FIG. 6 is a cross-sectional view of the substrate of FIG. 5 having deposited nanowires for a thermoelement of the thermal transfer device of FIG. 3 in accordance with aspects of the present technique.

FIG. 6 illustrates a cross-sectional view of an exemplary pattern 92 of nanowires deposited on the substrate 72 of FIG. 5 for the thermal transfer device of FIGS. 1-3 in accordance with aspects of the present technique. In this embodiment, a plurality of nanowires 94 is disposed within the pores 90 of the thermally insulating template 88. In the illustrated embodiment, the thermally insulating template 88 includes anodic aluminum oxide. In a presently contemplated configuration, the plurality of nanowires 94 includes one-dimensional nanowires or zero-dimensional superlattice or segmented nanowires where quantum effects are dominant. Further, the electronic density of states of the charge carriers and phonon transmission characteristics can be controlled by altering the size of the structure and composition of the nanowires 94 thereby enhancing the efficiency of the thermoelectric devices that is characterized by the figure-of-merit of the thermoelectric device. As used herein, "figure-of-merit" (ZT) refers to a measure of the performance of a thermoelectric device and is represented by the equation:

$$ZT = \alpha^2 T/\rho K_T \tag{1}$$

where:
α is the Seebeck coefficient;
T is the absolute temperature;
ρ is the electrical resistivity of the thermoelectric material; and
$K_T$ is thermal conductivity of the thermoelectric material.

As mentioned above, the plurality of nanowires 94 includes a thermoelectric material to facilitate heat transfer via the plurality of nanowires 94 by a thermoelectric mechanism. Examples of thermoelectric materials include silicon germanium, bismuth alloy, lead telluride, bismuth telluride, III-V, IV, IV-VI, and II-VI semiconductors, and their combinations thereof.

In certain embodiments, the plurality of nanowires 94 is deposited on the substrate 72 through an electrochemical deposition process. In this embodiment, a substantially high current density of about 5-10 mA/cm² or constant, pulsed or alternating potential is applied for a short period of time of about 30 seconds to initiate the nucleation of nanowires 94 at the base of the pores 90 (see FIG. 5) within the thermally insulating template 88. Subsequently, a pre-determined current density of about 0.1-10 mA/cm² or constant pulsed or alternating potential is applied for growing the nanowires 94 inside the pores 90 within the thermally insulating template 88. In certain embodiments, a coating material such as represented by reference numeral 95 is disposed on sidewalls of areas of the thermally insulating template 88 between the plurality of nanowires 94 to separate the plurality of nanowires 94 and the thermally insulating template 88. In certain embodiments, the thermally insulating template 88 may be prepared by rinsing with deionized water and drying the rinsed thermally insulating template 88 in a stream of nitrogen or Argon. Subsequently, the thermally insulating template 88 may be transferred to an inductively coupled plasma (ICP) reactor where a fluorocarbon coating may be disposed on the thermally insulating template 88 through an octafluorocyclobutane ($C_4F_8$) or other chloro-fluoro-carbon or hydrochlor-fluoro-carbon plasma discharge maintained at pre-determined operating settings. In certain embodiments, the coating layer includes a polymer deposited by wetting, a self-assembling monolayer or a multilayer deposited from vapor phase or solution, a thin organic or inorganic layer deposited by layer-by-layer methods or electroless plating, or a combination of the above.

Figure 7:
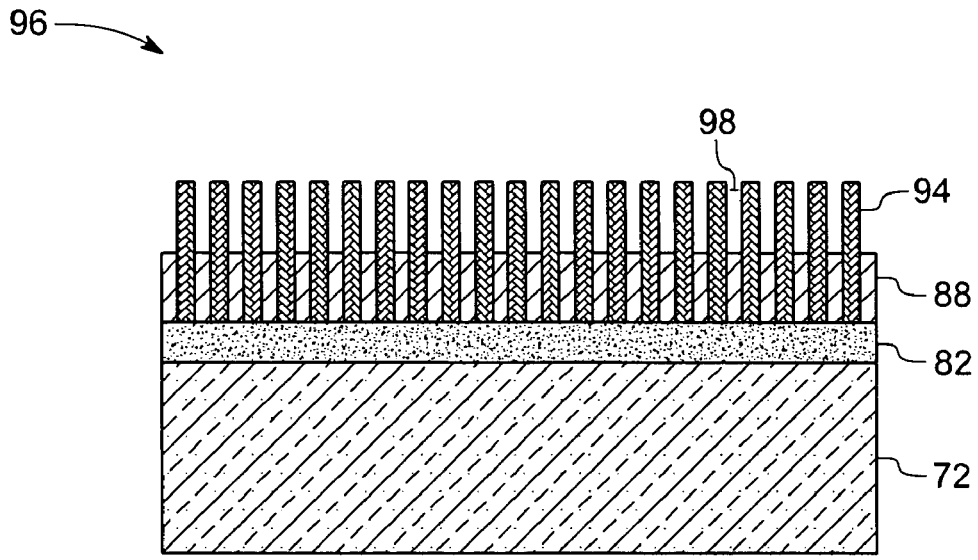
FIG. 7 is a cross-sectional view of the substrate of FIG. 6 having selectively etched portions of the thermally insulating template for the thermal transfer device of FIG. 3 in accordance with aspects of the present technique.

FIG. 7 illustrates a cross-sectional view of another exemplary configuration 96 of the substrate of FIG. 6 for use in the thermal transfer devices of FIGS. 1-3. In this embodiment, a portion of the thermally insulating template 88 is selectively etched via techniques such as chemical wet etching, H3PO4 for example, high density plasma etching or inductive coupled plasma etching to create etched portions 98 that are subsequently filled with a thermally insulating material as shown in FIG. 8.

Figure 8:
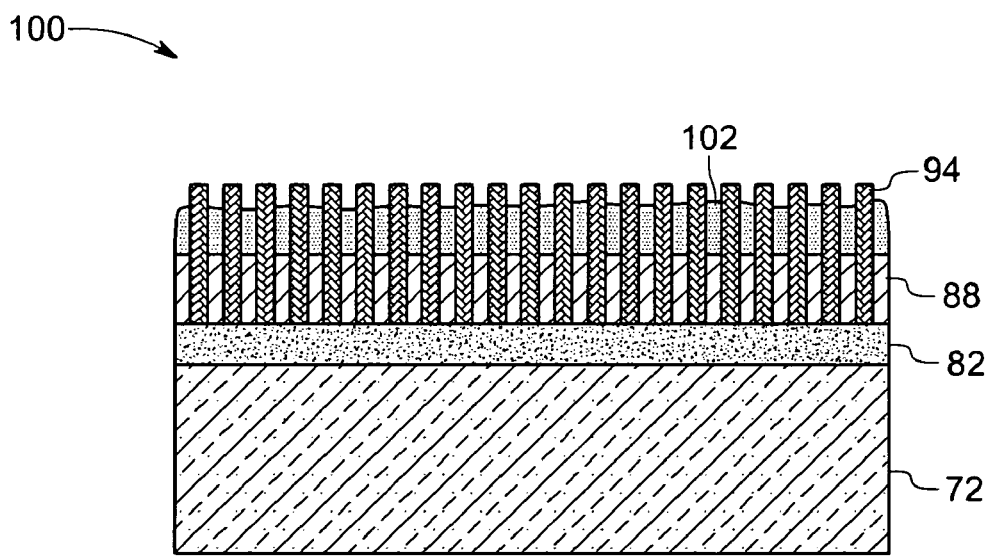
FIG. 8 is a cross-sectional view of the substrate of FIG. 7 having a thermally insulating material disposed on the etched portions of the thermally insulating template for a thermoelement of the thermal transfer device of FIG. 3 in accordance with aspects of the present technique.

Referring now to FIG. 8 a cross-sectional view of an exemplary configuration 100 of the substrate 72 of FIG. 7 having a thermally insulating material 102 is illustrated. In the present exemplary embodiment, the thermally insulating material 102 includes a thermally insulating polymer. In the illustrated embodiment, the thermally insulating material 102 is disposed on the etched portions 98 (see FIG. 7) of the thermally insulating template 88 between the plurality of nanowires 94. In this embodiment, the thermally insulating material 102 is configured to substantially reduce heat conduction through the thermally insulating template 88. In one embodiment, the thermally insulating material is a polymer such as parylene, or PMMA, or other thermally insulating organic materials. In this embodiment, parylene may be deposited on the etched portions 98 by a vapor deposition polymerization process.

Figure 9:
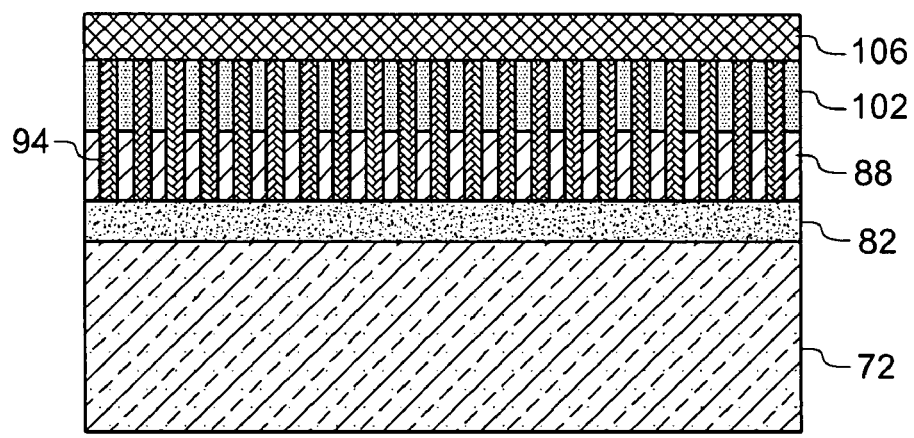
FIG. 9 is a cross-sectional view of the substrate of FIG. 8 having a metal coating disposed on the nanowires and the thermally insulating material in accordance with aspects of the present technique.

FIG. 9 illustrates another exemplary configuration 104 of the substrate 72 of FIG. 8 having a metal coating 106 disposed on the nanowires 94 and the thermally insulating material 102. In this embodiment, the metal coating 106 includes a capping metal layer. Further, the metal coating 106 is disposed on the thermally insulating material 102 and the nanowires 94 by utilizing techniques such as electrochemical deposition (ECD), electroplating, sputtering and so forth. In certain embodiments, planarization of the surface of the metal coating 106 may be achieved through chemical mechanical polishing (CMP), mechanical polishing, or etch-back techniques.

Figure 10:
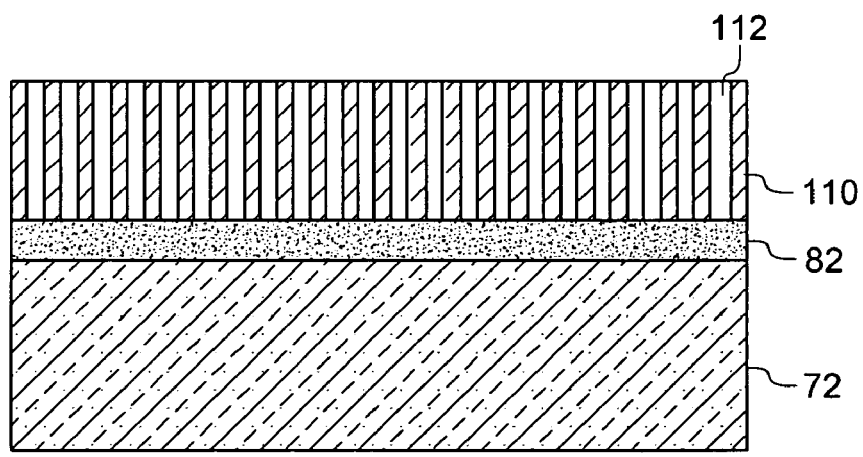
FIG. 10 is a cross-sectional view of a substrate having a first thermally insulating template for a two-layered thermal transfer device in accordance with aspects of the present technique.
Figure 11:
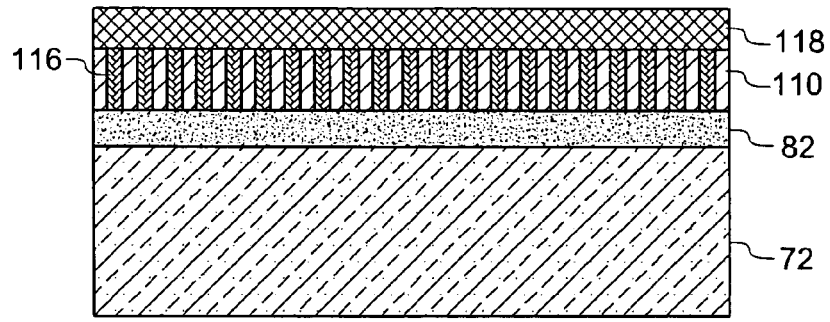
FIG. 11 is a cross-sectional view of the substrate of FIG. 10 having nanowires and a metal coating for the two-layered thermal transfer device in accordance with aspects of the present technique.

The thermal transfer device of FIGS. 1-3 may include multiple layers, each of the layers having a plurality of nanowires to provide appropriate materials composition and doping concentrations to match the temperature gradient between hot side and cold side for achieving maximum figure-of-merit (ZT) and efficiency. FIG. 10 illustrates a cross-sectional view of a first layer 108 of a two-layered thermal transfer device. In this embodiment, the first layer 108 includes the substrate 72 having a first thermally insulating template 110. In one embodiment, the insulating template 110 includes anodic aluminum oxide that may be fabricated as illustrated with reference to FIGS. 4 and 5. In certain embodiments, the thermally insulating template 110 may include porous anodic alumina, polycarbonate, aerogels, porous glass or different combinations thereof. In this embodiment, the first thermally insulating template 110 includes pores 112 within the first thermally insulating template 110 for depositing nanowires as illustrated in FIG. 11. As described above, an additional metal coating may be disposed on the bottom surface of the insulating template 110 and on the top surface of the substrate 72.

Referring now to FIG. 11, a cross-sectional view of an exemplary structure 114 of the first layer 108 of FIG. 10 is illustrated. In this embodiment, a plurality of nanowires 116 is deposited within the pores 112 of the thermally insulating template 110 through an electrochemical deposition process as described above. Further, a metal coating 118 is disposed on the nanowires 116 and portions of the thermally insulating template 110 between the nanowires 116. In certain embodiments, the metal coating 118 may be deposited by techniques such as electrochemical deposition (ECD), electroplating, sputtering and so forth.

Figure 12:
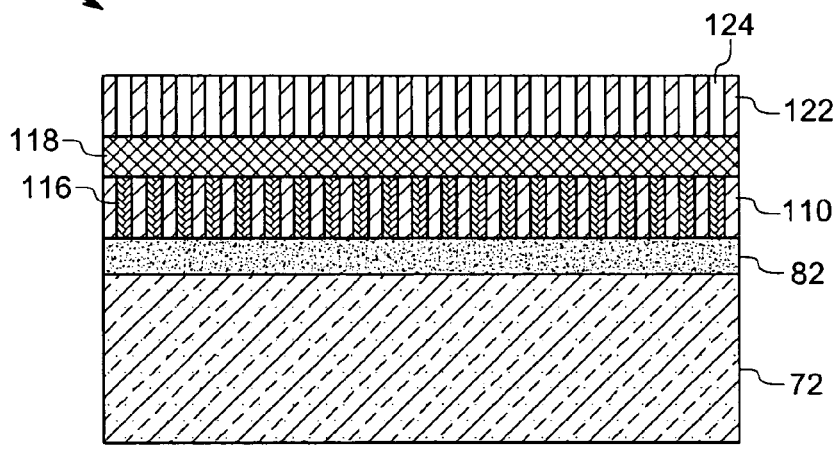
FIG. 12 is a cross-sectional view of the substrate of FIG. 11 having a second thermally insulating template for the two-layered thermal transfer device in accordance with aspects of the present technique.

FIG. 12 illustrates a cross-sectional view of an exemplary configuration 120 of the two-layered thermal transfer device. In this embodiment, a second thermally insulating template 122 is disposed on the metal coating 118. In one embodiment, the second insulating template 122 includes anodic aluminum oxide that may be fabricated as illustrated with reference to FIGS. 4 and 5. In certain other embodiments, the second insulating template 122 may include polycarbonate, silica aerogel, porous glass or different combinations thereof. The second insulating template 122 includes pores 124 for deposition of a second layer of nanowires within the second insulating template 122 as described below with reference to FIG. 13. Again, a metal coating may be disposed on the bottom surface of the second insulating template 122 to facilitate bonding between the layers.

Figure 13:
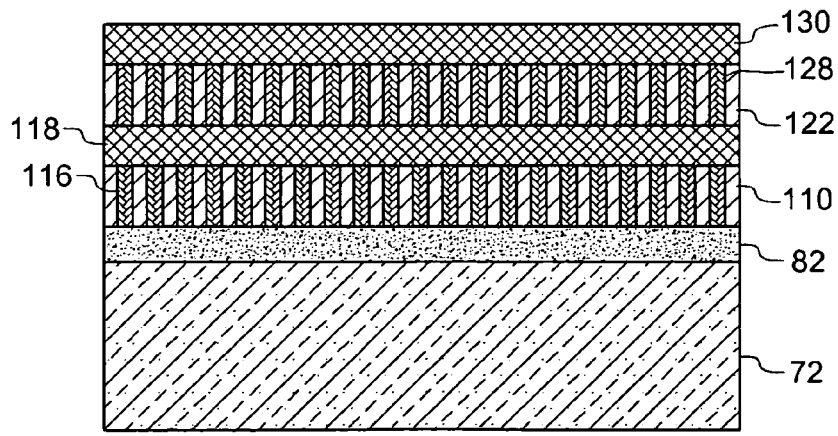
FIG. 13 is a cross-sectional view of the substrate of FIG. 12 having nanowires disposed within the second thermally insulating template and a metal coating layer for the two-layered thermal transfer device in accordance with aspects of the present technique.

Referring now to FIG. 13, another exemplary configuration 126 of the second layer of the two-layered thermal transfer device is illustrated. The thermal transfer device 126 includes a plurality of nanowires 128 disposed within the pores 124 of the thermally insulating template 122. In a presently contemplated configuration, the plurality of nanowires 128 includes one-dimensional nanowires, or segmented nanowires, or zero-dimensional superlattice nanowires. In one embodiment, the plurality of nanowires 128 includes p-type nanowires. Alternatively, the plurality of nanowires 128 includes n-type nanowires. In this embodiment, the plurality of nanowires 128 includes a thermoelectric material to facilitate heat transfer via the plurality of nanowires 128 by a thermoelectric mechanism. Examples of thermoelectric materials include silicon germanium based alloys, bismuth alloy based alloys, lead telluride based alloys, bismuth telluride based alloys, and III-V, IV, IV-VI, and II-VI semiconductors having substantially high thermoelectric figure-of-merit, and their combinations thereof. Further, a metal coating 130 may be disposed on the nanowires 128 and portions of thermally insulating template 122 between the nanowires 128. Further, the plurality of nanowires 128 may have a different composition or doping concentration from the nanowires 116 to reflect the temperature gradient from top to bottom and are optimized for maximum figure-of merit for specific temperatures.

It should be noted that the two layered thermal transfer device of FIGS. 9-13 may include a thermally insulating material disposed on the first and second thermally insulating templates 110 and 122 as described with reference to FIG. 8. In this embodiment, the first or second thermally insulating templates 110 and 122 may be selectively etched by techniques such as chemical wet etching, high density plasma etching or inductive coupled plasma etching. Further, a thermally insulating material may be disposed on the etched portions of the first or second thermally insulating templates 110 and 122 between the nanowires 116 and 128 for substantially reducing heat conduction through the thermally insulating templates 110 and 122. In one embodiment, the thermally insulating material includes parylene. In this embodiment, parylene may be deposited on the etched portions by a vapor deposition polymerization process. The thermal transfer device described above includes two layers having a plurality of nanowires disposed within each layer. However, other configurations of the thermal transfer device having larger number of layers may be envisaged.

Figure 14:
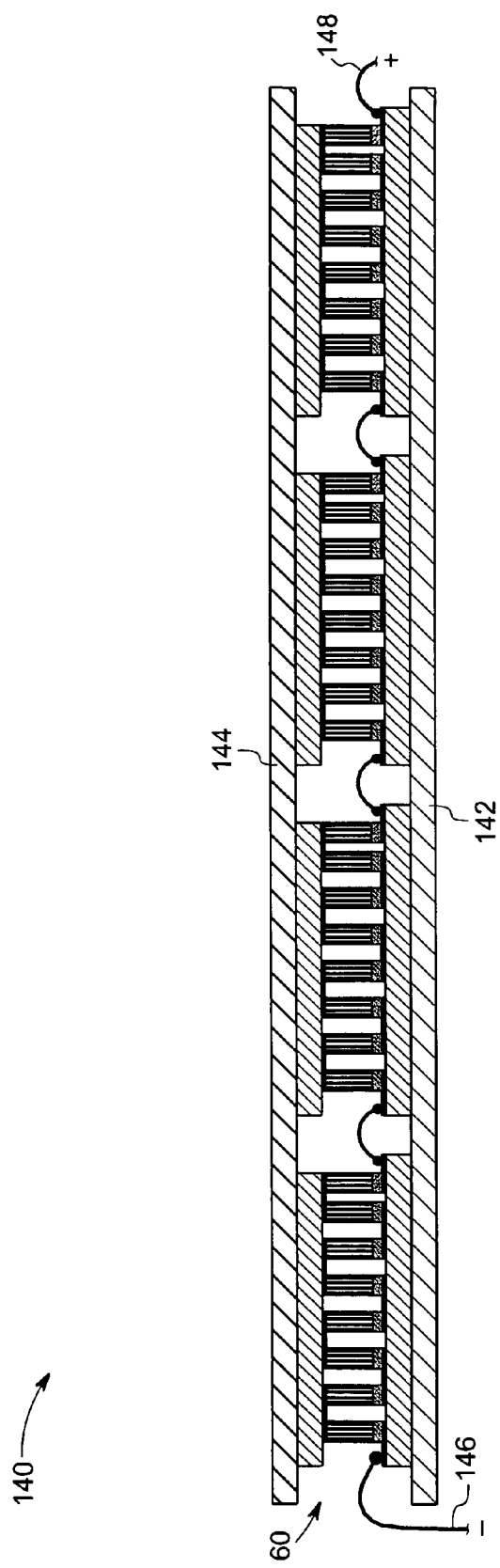
FIG. 14 is a diagrammatical side view illustrating an assembled module of a thermal transfer device having a plurality of thermal transfer units in accordance with embodiments of the present technique.

FIG. 14 illustrates a cross-sectional side view of a thermal transfer device or an assembled module 140 having a plurality of thermal transfer devices or thermal transfer units 60 in accordance with embodiments of the present technique. In the illustrated embodiment, the thermal transfer units 60 are mounted between opposite substrates 142 and 144 and are electrically coupled to create the assembled module 140. In this manner, the thermal transfer devices 60 cooperatively provide a desired heating or cooling capacity, which can be used to transfer heat from one object or area to another, or provide a power generation capacity by absorbing heat from one surface at higher temperatures and emitting the absorbed heat to a heat sink at lower temperatures. In certain embodiments, the plurality of thermal transfer units 60 may be coupled via a conductive joining material, such as silver filled epoxy or a metal alloy. The conductive joining material or the metal alloy for coupling the plurality of thermal transfer devices 60 may be selected based upon a desired processing technique and a desired operating temperature of the thermal transfer device. Finally, the assembled module 60 is coupled to an input voltage source via leads 146 and 148. In operation, the input voltage source provides a flow of current through the thermal transfer units 60, thereby creating a flow of charges via the thermoelectric mechanism between the substrates 142 and 144. As a result of this flow of charges, the thermal transfer devices 60 facilitate heat transfer between the substrates 142 and 144. Similarly, the thermal transfer devices 60 may be employed for power generation and/or heat recovery in different applications by maintaining a thermal gradient between the two substrates 142 and 144

Figure 15:
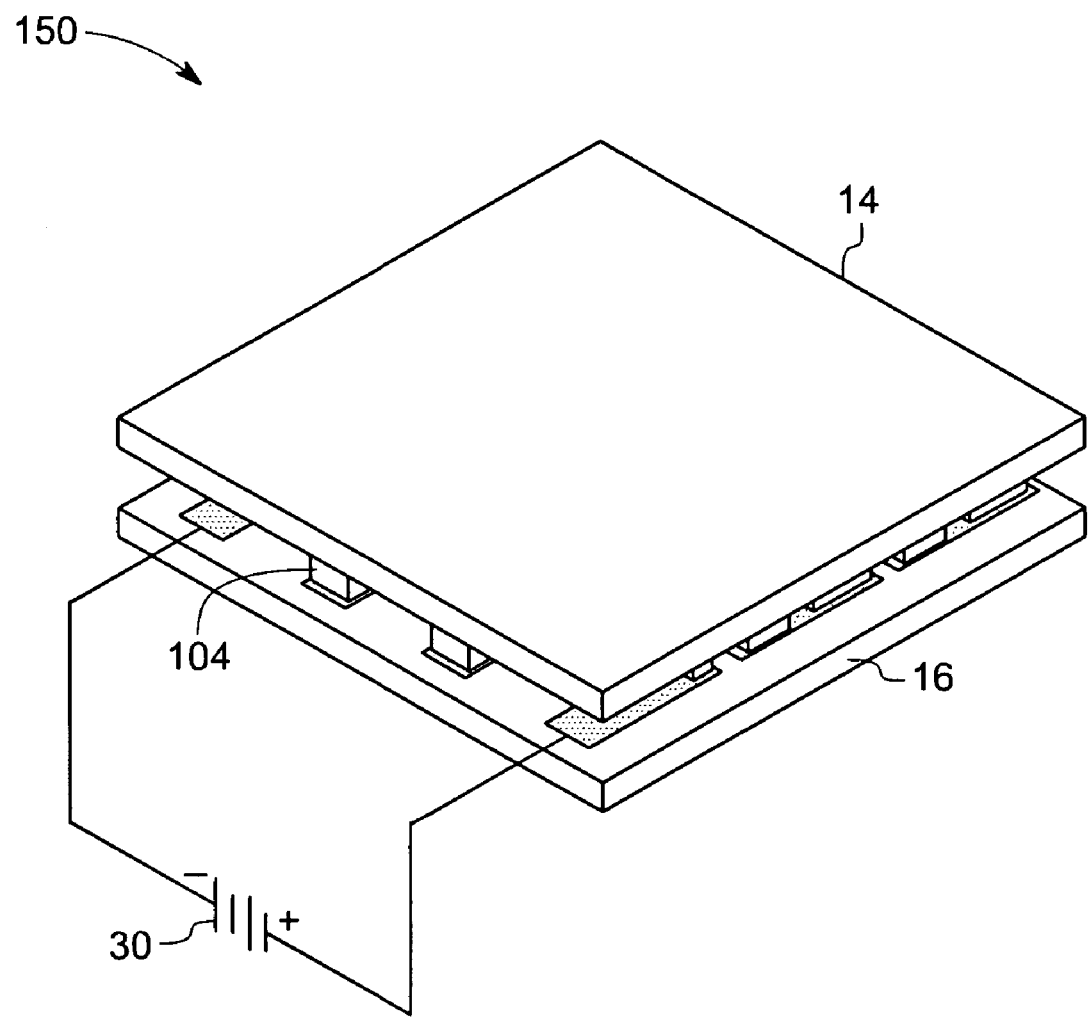
FIG. 15 is a perspective view illustrating a module having an array of thermal transfer devices in accordance with embodiments of the present technique.

FIG. 15 illustrates a perspective view of a thermal transfer module 150 having an array of thermal transfer thermoelements 104 in accordance with embodiments of the present technique. In this embodiment, the thermal transfer devices 104 are employed in a two-dimension array to meet a thermal management need of an environment or application. The thermal transfer devices 104 may be assembled into the heat transfer module 150, where the devices 104 are coupled electrically in series and thermally in parallel to enable the flow of charges from the first object 14 in the module 150 to the second object 16 thereby facilitating heat transfer between the first and second objects 14 and 16 in the module 150. It should be noted that the voltage source 30 may be a voltage differential that is applied to achieve heating or cooling of the first or second objects 14 and 16. Alternatively, the voltage source 30 may represent an electrical voltage generated by the module 150 when used in a power generation application.

Figure 16:
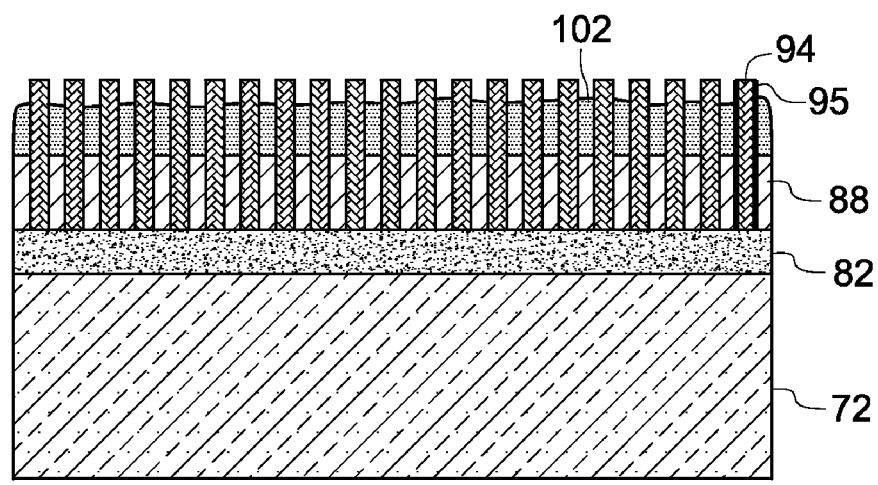
FIG. 16 is a cross-sectional view of the substrate of FIG. 8 having a coating disposed on sidewalls of areas of the thermally insulating template disposed between the plurality of nanowires.

FIG. 16 illustrates another exemplary configuration 154 of the substrate 72 of FIG. 8 having coating 95 disposed on sidewalls of areas of the thermally insulating template 88 disposed between the plurality of nanowires 94. In this embodiment, the layer 95 includes a polymer. Further, the coating layer is deposited by wetting, a self-assembling monolayer or a multilayer deposited from vapor phase or solution, a thin organic or inorganic layer deposited by layer-by-layer methods or electroless plating, or a combination of the above. In the illustrated embodiment, joining material 82 is disposed on the substrate 72. Further, the thermally insulating material 102 is disposed on the etched portions 98 (see FIG. 7) of the thermally insulating template 88 between the plurality of nanowires 94. In this embodiment, the thermally insulating material 102 is configured to substantially reduce heat conduction through the thermally insulating template 88. In one embodiment, the thermally insulating material is a polymer such as parylene, or PMMA, or other thermally insulating organic materials. In this embodiment, parylene may be deposited on the etched portions 98 by a vapor deposition polymerization process.

Alternatively, the thermal transfer device described herein may utilize a naturally occurring or manufactured heat source to generate power. For example, the thermal transfer devices described herein may be used in conjunction with geothermal based heat sources where the temperature differential between the heat source and the ambient (whether it be water, air, etc.) facilitates power generation. Similarly, in an aircraft engine the temperature difference between the engine core air flow stream and the outside air flow stream results in a temperature differential through the engine casing that may be used to generate power. Such power may be used to operate or supplement operation of sensors, actuators, or any other power applications for an aircraft engine or aircraft. Additional examples of applications within which thermoelectric devices described herein may be used include gas turbines, steam turbines, vehicles, and so forth. Such thermoelectric devices may be coupled to photovoltaic or solid oxide fuel cells that generate heat thereby boosting overall system efficiencies.

The thermal transfer devices described above may also be employed for thermal energy conversion and for thermal management. It should be noted that the materials and the manufacturing techniques for the thermal transfer device may be selected based upon a desired thermal management need of an object. Such devices may be used for cooling of microelectronic systems such as microprocessor and integrated circuits. Further, the thermal transfer devices may be employed for thermal management of semiconductor devices, photonic devices, and infrared sensors.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A device comprising:
   a first thermally conductive substrate having a first patterned electrode disposed thereon;
   a second thermally conductive substrate having a second patterned electrode disposed thereon, wherein the first and second thermally conductive substrates are arranged such that the first and second patterned electrodes are adjacent to one another;
   a thermally insulating template disposed between the first and second patterned electrodes;
   a plurality of nanowires disposed within the thermally insulating template disposed between the first and second patterned electrodes, wherein the plurality of nanowires is formed of a thermoelectric material;
   a coating disposed on sidewalls of areas of the thermally insulating template disposed between the plurality of nanowires; and
   a thermally insulating material disposed on an etched portion of the thermally insulating template between the plurality of nanowires.

2. The device of claim 1, wherein the first and second thermally conductive substrates comprise an electrically insulating aluminum nitride ceramic, or an electrically insulating silicon carbide ceramic.

3. The device of claim 1, wherein the thermoelectric material comprises silicon germanium based alloys, or bismuth antimony based alloys, or lead telluride based alloys, or bismuth telluride based alloys, III-V, IV, V, IV-VI, and II-VI semiconductors, or any combination thereof.

4. The device of claim 1, wherein the thermally insulating template comprises anodic aluminum oxide, or polycarbonate, or silica aerogel, or porous glass, or different combinations thereof.

5. The device of claim 1, wherein the coating comprises, a polymer deposited by wetting, a self-assembling monolayer or multilayer deposited from vapor phase or solution, or a thin organic layer, or an inorganic layer deposited by layer-by-layer methods or electroless plating, or different combinations thereof.

6. The device of claim 1, wherein the thermally insulating material comprises parylene.

7. The device of claim 1, further comprising a metal capping material disposed on the thermally insulating material and the plurality of nanowires.

8. The device of claim 1, wherein the plurality of nanowires comprise one-dimensional nanowires, or zero-dimensional superlattice nanowires, or segmented nanowires.

9. The device of claim 8, wherein each of the plurality of nanowires comprises a p-type nanowire, or an n-type nanowire that is deposited on a conductive substrate.

10. The device of claim 1, wherein the plurality of nanowires is disposed within multiple layers between the first and second patterned electrodes.

11. The device of claim 1, further comprising a plurality of thermal transfer units, each unit having a plurality of nanowires disposed between the first and second patterned electrodes, wherein the plurality of units are electrically coupled between opposite substrates.

12. The device of claim 1, wherein the device is configured to generate power by substantially maintaining a temperature gradient between the first and second thermally conductive substrates.

13. The device of claim 1, wherein introduction of current flow between the first and second thermally conductive substrates enables heat transfer between the first and second thermally conductive substrates via a flow of charge between the first and second thermally conductive substrates.

14. The device of claim 1, wherein the length of the nanowires ranges from about 1 µm to about 1000 µm, and the diameter of the nanowires ranges from about 1 nanometer to about 500 nanometers.

15. A vehicle, comprising the device of claim 1, wherein the device is configured to generate power, or to provide cooling of components of the vehicle.

16. A turbine, comprising the device of claim 1, wherein the device is configured to generate power via a temperature gradient between components of the turbine, or to provide heating or cooling of the components of the turbine.

17. A solid oxide fuel cell, comprising the device of claim 1, wherein the device is coupled to the solid oxide fuel cell for power generation through heat generated from the solid oxide fuel cell.

18. A cooling system, comprising the device of claim 1, wherein the device is configured to provide cooling of an environment.

19. A heating system, comprising the device of claim 1, wherein the device is configured to provide heating of an environment.

20. An aircraft engine, comprising the device of claim 1, wherein the device is configured to generate power for use by components of the engine, or to provide cooling of the components of the aircraft engine.

21. The aircraft engine of claim 20, wherein the power is generated via a temperature difference between the engine airflow stream and the outside airflow stream.

22. A power source comprising the device of claim 1, wherein the device is configured to generate power based at least in part upon a geothermal heat source.

23. A system, comprising:
   a heat source;
   a heat sink; and
   a thermoelectric device coupled between the heat source and the heat sink and configured to provide cooling or to generate power, the device comprising;
   a first thermally conductive substrate having a first patterned electrode disposed thereon;
   a second thermally conductive substrate having a second patterned electrode disposed thereon, wherein the first and second thermally conductive substrates are arranged such that the first and second patterned electrodes are adjacent to one another;

a thermally insulating template disposed between the first and second patterned electrodes;

a plurality of nanowires disposed within the thermally insulating template disposed between the first and second patterned electrodes, wherein the plurality of nanowires is formed of a thermoelectric material;

a coating disposed on sidewalls of areas of the thermally insulating template disposed between the plurality of nanowires; and a thermally insulating material disposed on an etched portion of the thermally insulating template between the plurality of nanowires.

24. The system of claim 23, wherein the heat source consists of a vehicle.

25. The system of claim 23, wherein the heat source is selected from a group consisting of a cooling system, a heating system, a solid oxide fuel cell and a geothermal source.

* * * * *

UNITED STATES PATENT AND TRADEMARK OFFICE
CERTIFICATE OF CORRECTION

PATENT NO. : 8,039,726 B2  
APPLICATION NO. : 11/138615  
DATED : October 18, 2011  
INVENTOR(S) : Zhang et al.

Page 1 of 1

It is certified that error appears in the above-identified patent and that said Letters Patent is hereby corrected as shown below:

In Column 10, Line 51, below "Process." insert -- The various aspects of the techniques described above find utility in a variety of heating/ cooling systems, such as refrigeration, air conditioning, electronics cooling, industrial temperature control, and so forth. The thermal transfer devices as described above may be employed in air conditioners, water coolers, climate controlled seats, and refrigeration systems including both household and industrial refrigeration. For example, such thermal transfer devices may be employed for cryogenic refrigeration, such as for liquefied natural gas (LNG) or superconducting devices. Further, the thermal transfer devices as described above may be employed for cooling of components in various systems, such as, but not limited to vehicles, turbines and aircraft engines. For example, a thermal transfer device may be coupled to a component of an aircraft engine such as, a fan, or a compressor, or a combustor or a turbine case. An electric current may be passed through the thermal transfer device to create a temperature differential to provide cooling of such components. --, as a new paragraph.

Signed and Sealed this  
Third Day of July, 2012

David J. Kappos  
*Director of the United States Patent and Trademark Office*